(12) United States Patent
Meyer et al.

(10) Patent No.: US 6,755,666 B2
(45) Date of Patent: Jun. 29, 2004

(54) GUIDE INSERT FOR PCI CONNECTOR RECEPTACLE

(75) Inventors: Charles S. Meyer, Nevada City, CA (US); Robert W. Hudelson, Grass Valley, CA (US); Michael R. Deering, Rancho Cordova, CA (US)

(73) Assignee: Nvision, Inc., Grass Valley, CA (US)

( * ) Notice: Subject to any disclaimer, the term of this patent is extended or adjusted under 35 U.S.C. 154(b) by 0 days.

(21) Appl. No.: 10/418,511

(22) Filed: Apr. 16, 2003

(65) Prior Publication Data

US 2003/0181080 A1 Sep. 25, 2003

Related U.S. Application Data

(63) Continuation of application No. 09/790,365, filed on Feb. 21, 2001, now Pat. No. 6,568,944.

(51) Int. Cl.[7] .............................................. H01R 12/00
(52) U.S. Cl. ........................................................ 439/79
(58) Field of Search ..................... 439/69–85, 374–379, 439/630–632, 59–68

(56) References Cited

U.S. PATENT DOCUMENTS 5,236,368 A * 8/1993 Adams et al. ................. 439/79
5,709,555 A * 1/1998 Noschese ...................... 439/79

* cited by examiner

*Primary Examiner*—Tho D. Ta
*Assistant Examiner*—Larisa Tsukerman
(74) *Attorney, Agent, or Firm*—John Smith-Hill; Smith-Hill and Bedell

(57) ABSTRACT

A guide insert is provided for engagement with an edge connector receptacle including a housing having an insertion face and defining a slot for receiving a card edge inserted into the slot along an insertion axis. The guide insert has a body portion that fits over the insertion face of the housing and is formed with first and second aligned slot-form apertures for providing access to first and second segments respectively of the slot defined by the housing. A tab projects from the body portion of the guide insert between the first and second apertures for entering the slot when the body portion engages the insertion face of the housing. The tab has two opposite faces presented towards two opposite sides respectively of the slot.

7 Claims, 3 Drawing Sheets

GUIDE INSERT FOR PCI CONNECTOR RECEPTACLE

CROSS-REFERENCE TO RELATED APPLICATION

This is a continuation of application Ser. No. 09/790,365 filed Feb. 21, 2001 now U.S. Pat. No. 6,568,944, the entire disclosure of which is hereby incorporated by reference herein for all purposes.

BACKGROUND OF THE INVENTION

This invention relates to a guide insert for PCI (Peripheral Component Interface) connector receptacle.

It is common practice to make electrical connections between circuitry on a printed circuit board and a power supply or an external signal source or signal destination by mechanically engaging a connection edge of the board with a mating receptacle and simultaneously establishing electrically conductive connections between an electrically conductive structure at the connection edge of the board and a complementary electrically conductive structure incorporated in the receptacle and including contacts that are electrically connected to the power supply or to the signal source or destination, as the case may be. In one conventional case, the receptacle and electrically conductive structure incorporated therein is known as a card edge connector and the conductive structure at the connection edge of the circuit board is a printed pattern of conductive strips. It is possible to provide connections at a density as high as 38 pins per inch of circuit board edge with this type of connection scheme.

The edge connector receptacle typically includes a housing made of electrically insulating material and defining a slot for receiving the connection edge of a circuit board and a linear array of contacts distributed along the slot. Each contact may be in the form of a pair of pins at opposite respective sides of the slot. One form of edge connector receptacle is known as the PCI receptacle, and in its smaller size the PCI receptacle has 60 contacts organized in one group of 11 contacts and one group of 49 contacts spaced apart by an alignment web of the housing. A circuit board that is designed to engage the PCI receptacle is formed with a notch that the alignment web enters when the connection edge of the circuit board is fitted in the slot of the receptacle. Since the alignment web is asymmetrically positioned lengthwise of the slot, there is only one orientation in which the connection edge can be inserted in the slot.

The copending application Ser. No. 09/790,365 discloses an arrangement in which two or more circuit boards are mechanically engaged with a single PCI receptacle. Since the PCI receptacle has a single alignment web, use of a single PCI receptacle to make connections to two or more circuit boards necessitates that at least one of the circuit boards should not have a notch that receives the alignment web of the receptacle. Accordingly, there is a possibility that the circuit boards will not be properly positioned in the slot relative to the contacts of the PCI receptacle.

SUMMARY OF THE INVENTION

In accordance with a first aspect of the invention there is provided a guide insert for engagement with an edge connector receptacle including a housing having an insertion face and defining a slot for receiving a card edge inserted into the slot along an insertion axis, the guide insert comprising a body portion that fits over the insertion face of the housing and is formed with first and second aligned slot-form apertures for providing access to first and second segments respectively of the slot defined by the housing, and a tab projecting from the body portion of the guide insert between the first and second apertures for entering the slot when the body portion engages the insertion face of the housing, the tab having two opposite faces presented towards two opposite sides respectively of the slot.

In accordance with a second aspect of the invention there is provided a guide insert for engagement with an edge connector receptacle including a housing having an insertion face and defining a slot for receiving a card edge inserted into the slot along an insertion axis, the guide insert comprising a body portion that fits over the insertion face of the housing and is formed with first and second aligned slot-form apertures for providing access to first and second segments respectively of the slot defined by the housing, and at least first and second tabs projecting from the body portion of the guide insert for entering the slot when the body portion engages the insertion face of the housing, each tab having two opposite faces presented towards two opposite sides respectively of the slot, and wherein the first and second tabs are at opposite respective ends of the first aperture.

In accordance with a third aspect of the invention there is provided an article of manufacture comprising an edge connector receptacle including a housing having an insertion face and defining a slot for receiving a card edge inserted into the slot along an insertion axis, and a guide insert for engagement with the receptacle, the guide insert comprising a body portion that fits over the insertion face of the housing and is formed with first and second aligned slot-form apertures providing access to first and second segments respectively of the slot defined by the housing, and a tab projecting from the body portion of the guide insert between the first and second apertures into the slot defined by the housing, the tab having two opposite faces presented towards two opposite sides respectively of the slot.

In accordance with a fourth aspect of the invention there is provided an article of manufacture comprising an edge connector receptacle including a housing having an insertion face and defining a slot for receiving a card edge inserted into the slot along an insertion axis, and a guide insert for engagement with the receptacle, the guide insert comprising a body portion that fits over the insertion face of the housing and is formed with first and second aligned slot-form apertures providing access to first and second segments respectively of the slot defined by the housing, and at least first and second tabs projecting from the body portion of the guide insert into the slot defined by the housing, each tab having two opposite faces presented towards two opposite sides respectively of the slot, and wherein the first and second tabs are at opposite respective ends of the first aperture.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
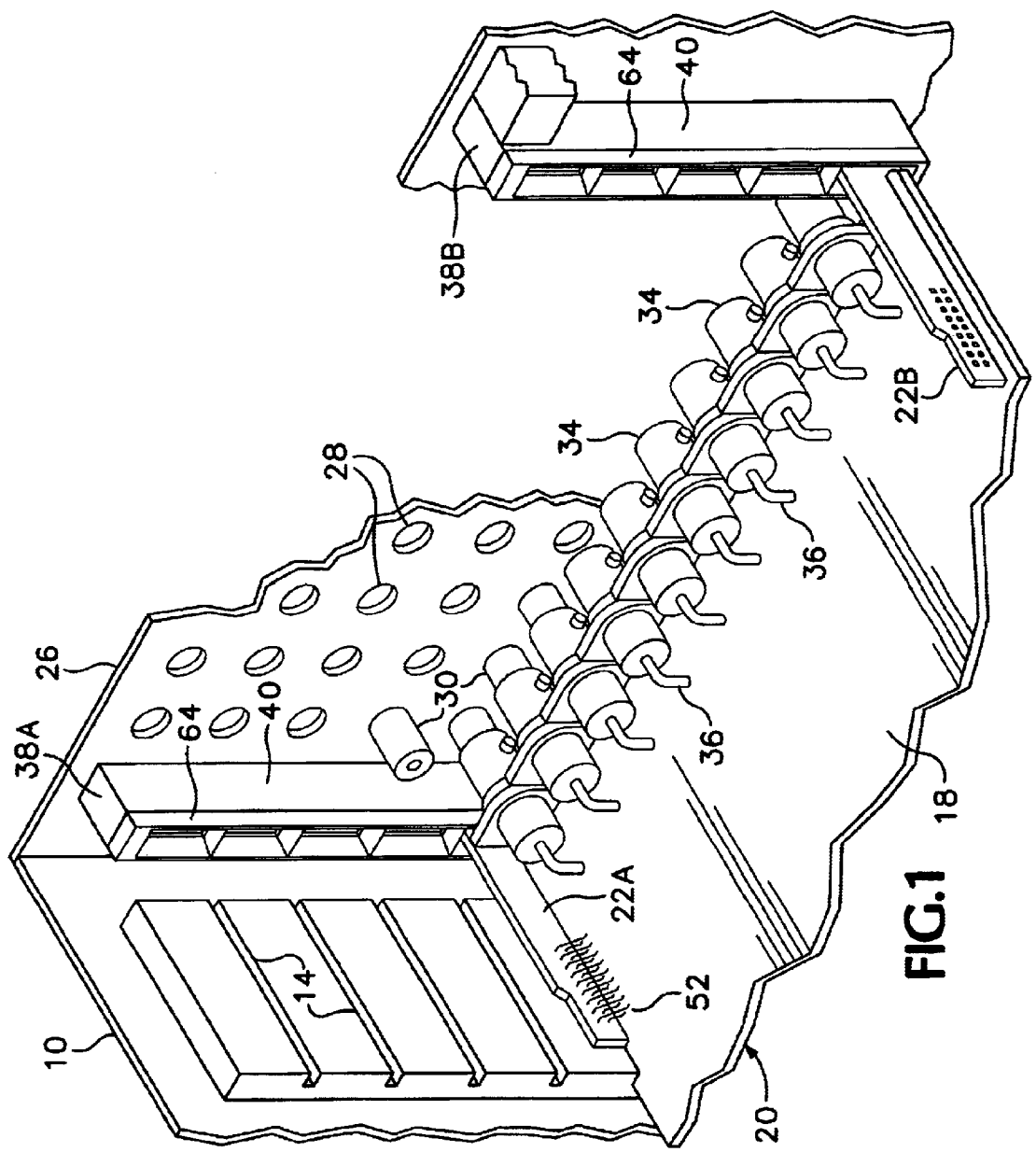
FIG. 1 is a partial perspective view of an item of electronic equipment in accordance with the present invention and illustrates a circuit board assembly.

FIG. 1 illustrates a frame having two opposite side walls 10 (only one of which is shown) each provided with five horizontal guide channels 14 for receiving respective longitudinal edges of printed circuit boards 18 (only one of which is shown). Each circuit board 18 is part of a circuit board assembly 20 including the circuit board 18 (the main circuit board) and two auxiliary circuit boards 22A. 22B (referred to generally as boards 22). The frame has a rear wall or bulkhead 26 formed with five rows of circular holes 28. A male/female BNC feed through 30 is mounted in each hole 28 with the male portion of the feed through presented towards the interior of the frame and the female portion presented towards the exterior, for receiving a BNC plug attached to a cable.

Several BNC receptacles 34 are attached to the main circuit board 18 on the upper side thereof. Each BNC receptacle has a signal lead 36 which is connected through conductor traces (not shown) of the circuit board to at least one electronic component on the circuit board. When the circuit board assembly 20 is inserted in the frame, the BNC receptacles 34 of the main circuit board engage respective feed throughs 30 on the bulkhead, providing a uniform characteristic impedance path from the circuit board to the female portion of the feed through.

Two PCI card edge connector receptacles 38A, 38B (referred to generally as receptacles 38) are firmly attached to the bulkhead 26. The PCI receptacles are vertically oriented and are positioned so that the BNC feed throughs 30 are between the two PCI receptacles 38.

Figure 4:
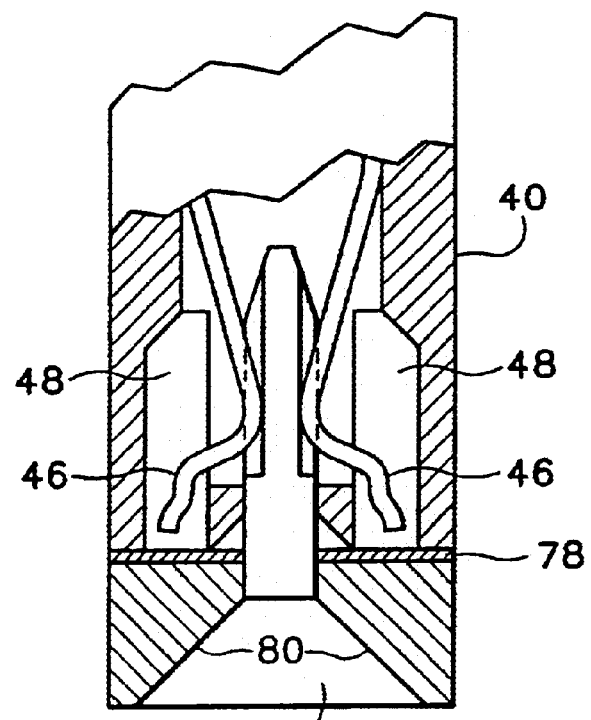
FIG. 4 is an enlarged sectional view of the receptacle and insert.

Each PCI receptacle 38 includes a body 40 of electrically insulating material which defines a slot 44 (FIG. 2) for receiving a connection edge of a printed circuit board. Sixty contacts, each composed of a pair of conductive pins 46 (FIG. 4), are mounted in the body of the PCI receptacle for engaging conductive strips on the connection edge of the circuit board. The tips of the pins are located in respective recesses 48 and the walls of the recesses prevent shorting of the pins of adjacent contacts.

The body 40 of the PCI receptacle includes an alignment web 42 which divides the slot 44 into two segments. The alignment web normally engages a notch in the edge of the circuit board to ensure that the connection edge is inserted in the proper orientation. The shorter segment of the slot accommodates 11 contacts and the longer segment accommodates 49 contacts.

Figure 2:
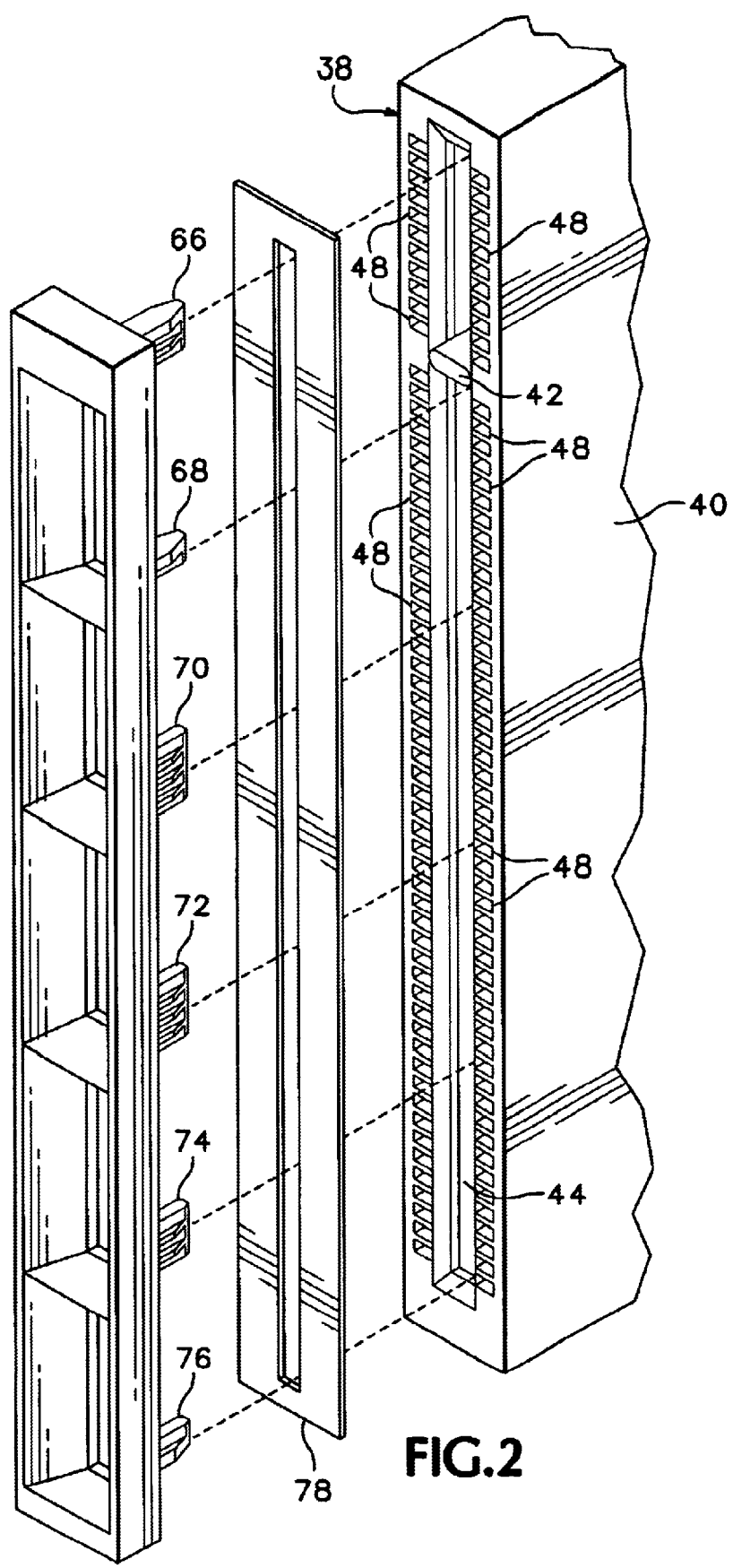
FIG. 2 is an enlarged perspective exploded view of a PCI receptacle that is included in the equipment shown in FIG. 1.
Figure 3:
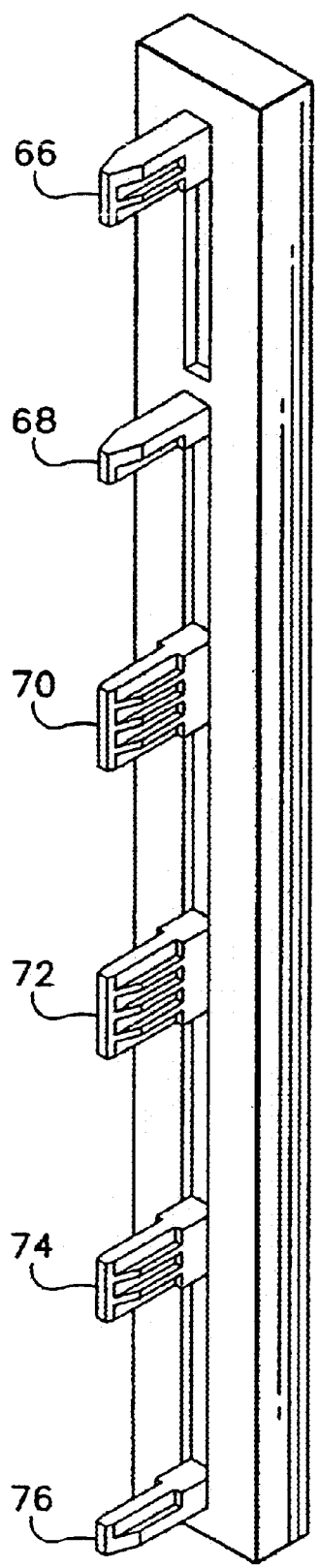
FIG. 3 is a perspective view of the PCI receptacle insert shown in FIG. 2, viewed from the rear.

As shown in FIG. 2, the shorter segment of the slot 44 is at the top of the receptacle. The adjacent contacts of the upper group of 11 contacts are at a uniform center-to-center spacing S and the adjacent contacts of the lower group of 49 contacts are at the same center-to-center spacing. The bottom contact in the upper group and the top contact in the lower group are at a center-to-center spacing 2S. Thus, it is convenient to refer to the contacts as being at positions 1–11 and 13–61, position 12 being occupied by the alignment web.

The two auxiliary circuit boards 22A, 22B are attached to the main circuit board 18 adjacent the longitudinal edges respectively. Each auxiliary circuit board 22 is perpendicular to the main board and extends parallel to the longitudinal edges and has a connection edge that extends beyond the connection edge of the main board approximately as far as the BNC receptacles. The auxiliary board is provided adjacent its connection edge with contact strips 4 of width and spacing for engagement with the contacts of a PCI receptacle. The contact strips are electrically connected to connector runs on the main board through conductive leads 52 that are soldered both to the auxiliary board and to the main board and thus serve to stabilize the auxiliary board relative to the main board.

The auxiliary boards 22A, 22B are positioned relative to the main board 18 and the PCI receptacles 38A, 38B are positioned relative to the guide channels 14 so that when the circuit board assembly 20 is placed in the frame, with the edges of the main board 18 in the channels 14, the BNC receptacles 34 on the main board are aligned with the feed throughs 30 in one row of holes 28 and the connection edges of the auxiliary boards 22A, 22B are aligned with the slots of the PCI receptacles 38A, 38B respectively. When the circuit board assembly is pushed home to the rear of the frame, the BNC receptacles 34 engage the feed throughs 30 and the connection edges of the auxiliary boards enter the slots of the PCI receptacles. Electrical contact is made between the contact strips of the auxiliary board 22A and nine of the contacts of the PCI receptacle 38A. The auxiliary board 22B engages the PCI receptacle 38B in analogous manner. Consequently, the auxiliary boards and the mating PCI receptacles provide edge connection capacity for 18 additional connections to the main board, and may be used to provide control signals and power to the electronic components on the main board.

FIG. 1 also illustrates a guide insert 64 for guiding the connection edges of the auxiliary circuit boards into the slot of the PCI receptacle. The guide insert 64 comprises an injection molded body of electrically insulating synthetic polymer material defining five slots, each of which spans nine contact positions. Six tabs 66–76 project from the body of the insert and are inserted in the slot of the PCI receptacle for holding the insert 64 in position relative to the body 40. It will be seen that each of the tabs has two opposite surfaces that are reticulated in accordance with the reverse image of the PCI contact pins. When the tabs are inserted in the slot of the PCI receptacle, at least one pair of contact pins slide in respective grooves of each tab so that the insert is accurately positioned lengthwise of the slot relative to the remaining contact pins and is securely held against disengagement from the PCI receptacle. The tabs 66, 68, 74 and 76 are positioned so that there is only one orientation in which the guide insert can be installed in the slot of the PCI receptacle, and in this orientation the tab 68, which has only one pair of opposed grooves, is immediately below the alignment web 42 and its grooves receive the pins of the contact at position 13 and isolate that contact.

The tab 66 has two grooves on each side and enters the slot at the very top of the receptacle, thus isolating the contacts at positions 1 and 2 of the connector. The tabs 70 and 72 each have four pairs of opposed grooves. The tab 70 isolates the contacts at positions 23–26 and the tab 72 isolates the contacts at positions 36–39. The tab 74 has three pairs of grooves and is positioned to isolate the contacts at positions 49–51, and the tab 76 has just one pair of grooves and is positioned to isolate the contact at position 61. It will thus be seen that through cooperation of the tabs 66–76 and the alignment web 42 of the PCI receptacle, the sixty contacts of the PCI receptacle are divided into five groups each of which contains nine contiguous, uniformly spaced contacts.

The entrance to each slot of the guide insert is surrounded by four guide surfaces 80 for guiding the connection edges of the auxiliary circuit boards into the proper respective positions in the slot of the PCI receptacle.

For added security, a strip of double sided adhesive tape 78 may be applied to the rear surface of the guide insert prior to installation in the PCI receptacle. The adhesive tape adheres to the insertion face of the housing and prevents inadvertent removal of the guide insert.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

What is claimed is:

1. A guide insert for engagement with an edge connector receptacle including a housing having an insertion face and defining a slot for receiving a card edge inserted into the slot along an insertion axis, the guide insert comprising:

a body portion that fits over the insertion face of the housing and is formed with first and second aligned slot-form apertures for providing access to first and second segments respectively of the slot defined by the housing, and a tab projecting from the body portion of the guide insert between the first and second apertures for entering the slot when the body portion engages the insertion face of the housing, the tab having two opposite faces presented towards two opposite sides respectively of the slot.

2. A guide insert for engagement with an edge connector receptacle including a housing having an insertion face and defining a slot for receiving a card edge inserted into the slot along an insertion axis, the guide insert comprising:

a body portion that fits over the insertion face of the housing and is formed with first and second aligned slot-form apertures for providing access to first and second segments respectively of the slot defined by the housing, and at least first and second tabs projecting from the body portion of the guide insert for entering the slot when the body portion engages the insertion face of the housing, each tab having two opposite faces presented towards two opposite sides respectively of the slot, and wherein the first and second tabs are at opposite respective ends of the first aperture.

3. A guide insert according to claim 2, comprising at least a third tab at opposite end of the second aperture from the first aperture.

4. An article of manufacture comprising an edge connector receptacle including a housing having an insertion face and defining a slot for receiving a card edge inserted into the slot along an insertion axis, and a guide insert for engagement with the receptacle, the guide insert comprising:

a body portion that fits over the insertion face of the housing and is formed with first and second aligned slot-form apertures providing access to first and second segments respectively of the slot defined by the housing, and a tab projecting from the body portion of the guide insert between the first and second apertures into the slot defined by the housing, the tab having two opposite faces presented towards two opposite sides respectively of the slot.

5. An article according to claim 4, wherein the receptacle includes two rows of contact pins at opposite sides respectively of the slot and the tab is formed in each of its two opposite faces with a groove for receiving a contact pin of each row.

6. An article of manufacture comprising an edge connector receptacle including a housing having an insertion face and defining a slot for receiving a card edge inserted into the slot along an insertion axis, and a guide insert for engagement with the receptacle, the guide insert comprising:

a body portion that fits over the insertion face of the housing and is formed with first and second aligned slot-form apertures providing access to first and second segments respectively of the slot defined by the housing, and at least first and second tabs projecting from the body portion of the guide insert into the slot defined by the housing, each tab having two opposite faces presented towards two opposite sides respectively of the slot, and wherein the first and second tabs are at opposite respective ends of the first aperture.

7. An article according to claim 6, wherein the receptacle housing includes an alignment web between the first and second segments of the slot and the tabs are positioned such as to permit engagement of the guide insert with the edge connector receptacle in only a single orientation.

* * * * *